(12) United States Patent
Culmer

(10) Patent No.: US 7,154,304 B2
(45) Date of Patent: Dec. 26, 2006

(54) ENHANCED PHASE AND FREQUENCY DETECTOR THAT IMPROVES PERFORMANCE IN THE PRESENCE OF A FAILING CLOCK

(75) Inventor: Andrew Culmer, Southampton (GB)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 11/180,279

(22) Filed: Jul. 12, 2005

(65) Prior Publication Data

US 2006/0076989 A1    Apr. 13, 2006

Related U.S. Application Data

(60) Provisional application No. 60/587,672, filed on Jul. 13, 2004.

(51) Int. Cl.
*G01R 25/00* (2006.01)
*H03D 13/00* (2006.01)

(52) U.S. Cl. .............................. 327/3; 327/12

(58) Field of Classification Search .................. 327/3, 327/12, 156
See application file for complete search history.

(56) References Cited

U.S. PATENT DOCUMENTS 5,936,430 A * 8/1999 Patterson ..................... 327/12
6,285,219 B1 * 9/2001 Pauls ............................ 327/3
6,590,427 B1 * 7/2003 Murphy et al. ............... 327/12
6,617,884 B1 * 9/2003 Wang et al. ................... 327/12
6,646,478 B1 * 11/2003 Lamb ........................... 327/12
2001/0007436 A1 * 7/2001 Dosho et al. ................ 331/11
2003/0090296 A1 * 5/2003 Yoo ............................. 327/12

* cited by examiner

*Primary Examiner*—Quan Tra
*Assistant Examiner*—Rey Aranda
(74) *Attorney, Agent, or Firm*—O'Melveny & Myers LLP

(57) ABSTRACT

A system and method of reducing the pulse width differential in a phase frequency detector (PFD) is provided. In a first embodiment, a PFD is construed using a plurality of flip-flops (or clocking devices) and a plurality of logic gates. A first set of flip-flops are adapted to receive a plurality of inputs and a plurality of clocks and to latch the inputs at transitions in the clocks. A first logic gate is then used to reset the first set of flip-flops and a second set of flip-flops if the inputs are latched (i.e., the clocks are active). If an input is not latched (i.e., a clock is inactive), then the first and second set of flip-flops are not reset, and the outputs of the PFD are forced to zero. Once the inactive clock is reactivated, a third set of flip-flops is used to hold the first set of flip-flops in a reset state for a period of time (e.g., half a clock cycle). Once the period of time elapses, the first set of flip-flops is released from its reset state, and normal operation is resumed. In a second embodiment, a signal (or an alarm) is provided to indicate that a clock has become inactive. In a third embodiment, at least one logic gate is used to force the first set of flip-flops into a reset state. This can be done, for example, when changing a clock's source or switching clocks.

23 Claims, 5 Drawing Sheets

ENHANCED PHASE AND FREQUENCY DETECTOR THAT IMPROVES PERFORMANCE IN THE PRESENCE OF A FAILING CLOCK

CROSS-REFERENCE TO RELATED APPLICATION

This application claims the benefit pursuant to 35 U.S.C. § 119(e) of U.S. Provisional Application No. 60/587,672, filed Jul. 13, 2004, which application is specifically incorporated herein, in its entirety, by reference.

BACKGROUND OF THE INVENTION

1. Field of the Invention

The present invention relates to phase frequency detectors (PFDs), and more particularly, to a system and method of detecting the absence (or failure) of a clock in a PFD and holding at least one output and/or device in a reset (or default) state until an active clock is detected.

2. Description of Related Art

Many electronic systems use internal clocks that are required to be phase-aligned to and/or frequency multiples of some external reference clock. For example, a central processing unit (CPU) might have an internal 2.4 GHz clock that is phase aligned to a bus clock running at 100 MHz. The frequency multiplication is important because multiplying frequencies on a circuit is much easier than transmitting 2.4 GHz clocks on a circuit board (or motherboard). The phase alignment is important so that data can be exchanged reliably between circuits in the 2.4 GHz core domain and the 100 MHz bus clock domain.

Typically, the reference clock enters a circuit and drives a phase locked loop (PLL), which then drives the system's clock distribution. PLLs generally include a phase frequency detector (PFD), a charge pump, a low pass filter, a bias generator, a voltage-controlled oscillator (or oscillation circuit), and an output converter. The function of the PFD is to compare the distributed clock to the incoming reference clock, and vary its output until the reference and feedback clocks are phase and frequency matched.

A commonly used PFD is the type 4 PFD, which includes two D flip-flops (e.g., a first and second flip-flop) and a NAND gate. A reference clock is provided to the first flip-flop and a feedback clock, which is traditionally provided by the oscillation circuit, is provided to the second flip-flop. The outputs of the flip-flops (e.g., an UP output and a DOWN output) are provided to the oscillation circuit and used to adjust the feedback clock until the reference and feedback clocks are phase and frequency matched. The feedback and reference clocks are considered to be matched when the widths of the pulses in the UP and DOWN outputs are matched.

A drawback with the type 4 PFD is the time required to recover from an inactive or changed reference clock. For example, when the reference clock is turned off, the UP output goes to zero and the DOWN output becomes a flat non-zero DC voltage. When the reference clock is turned back on, the DOWN output (due to its flat non-zero DC voltage state) will most likely have a pulse width that is much larger than the pulse width of the UP output. The outputs will then need to be adjusted until their pulse widths match, which can be a time consuming process.

Accordingly, it would be very desirable to provide a PFD that minimizes or eliminates the pulse width differential between the UP and DOWN outputs in response to a disturbance in at least one clock.

SUMMARY OF THE INVENTION

In accordance with the teachings of the present invention, an enhanced phase frequency detector (PFD) is provided that reduces (and in some instances eliminates) the pulse width differential associated with clock interruption. In a first embodiment of the present invention, a PFD is constructed using a plurality of flip-flops (or clocking devices) and a plurality of logic gates. A first set of flip-flops is adapted to receive a plurality of inputs and a plurality of clocks and to latch the inputs at transitions in the clocks. A first logic gate is then used to reset the first set of flip-flops and a second set of flip-flops if the inputs are latched (i.e., if the clocks are active).

If an input is not latched (i.e., a clock is inactive), then the first and second set of flip-flops are not reset, and the outputs of the PFD are forced to zero. In one embodiment of the present invention, it is the second set of flip-flops that is responsible for forcing the outputs of the PFD to zero, particularly the output(s) associate with the active clock(s). Once the inactive clock is reactivated, a third set of flip-flops is used to hold the first set of flip-flops in a reset state for a period of time (e.g., half a clock cycle). Once the period of time elapses, the first set of flip-flops is released from its reset state, and normal operation is resumed.

In a second embodiment of the present invention, a signal (or an alarm) is provided to indicate that a clock has become inactive. This can be accomplished by placing signal lines on the outputs of the third set of flip-flops. For example, a signal produced by a first flip-flop in the third set of flip-flops is used to indicate that a second clock has failed, a signal produced by a second flip-flop in the third set of flip-flops is used to indicate that a first clock has failed, etc.

In a third embodiment of the present invention, at least one logic gate is used to force the first set of flip-flops into a reset state. This is advantageous, for example, when a clock is being changed from one source to another. By placing the first set of flip-flops into a reset state before the clocks are switched, and by releasing the first set of flip-flops from the reset state after the clocks are switched, the pulse width differential in the outputs is reduced.

A more complete understanding of a system and method of detecting the absence (or failure) of a clock in a PFD and holding at least one output and/or device in a reset (or default) state until an active clock is detected will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention provides a system and method of detecting the presence or absence of a clock in a phase frequency detector (PFD) and modifying at least one output and/or device of the PFD accordingly. In the detailed description that follows, like element numerals are used to describe like elements illustrated in one or more figures.

Figure 1:
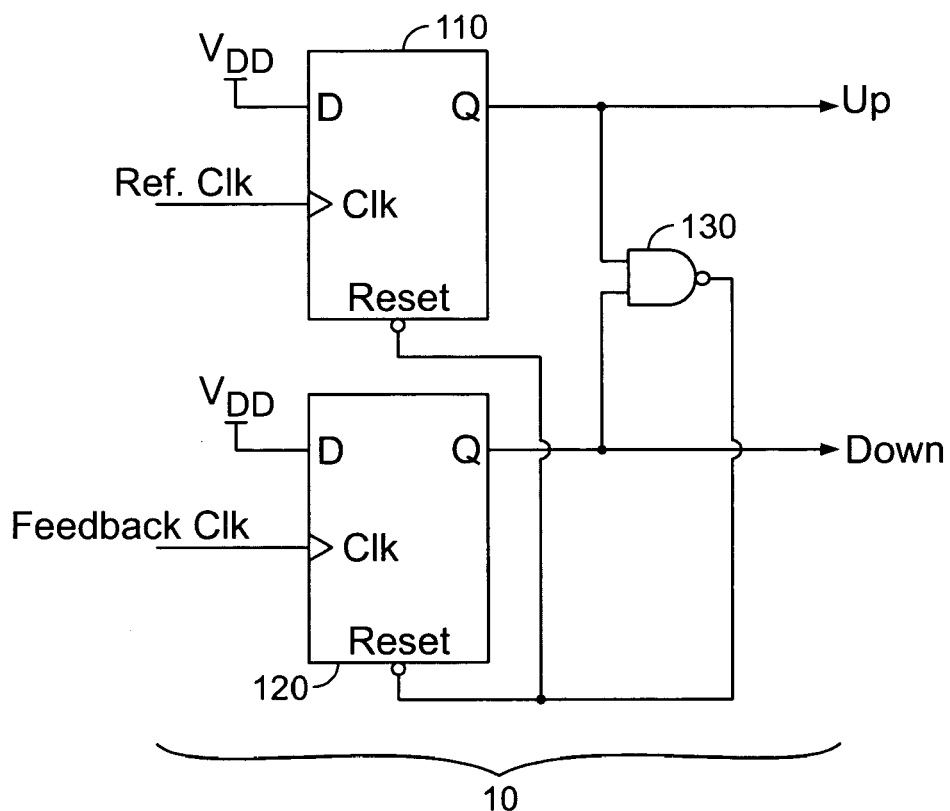
FIG. 1 illustrates a prior art type 4 phase and frequency detector (PFD)

A traditional prior art PFD is illustrated in FIG. 1. The PFD 10 includes a first D flip-flop 110 connected to $V_{DD}$ (e.g., five volts) and a reference clock, a second D flip-flop 120 connected to $V_{DD}$ and a feedback clock, and a NAND gate 130. The first and second D flip-flops 110, 120 are adapted to output $V_{DD}$ at rising edges of the reference and feedback clocks, respectively, which are then provided to the NAND gate 130. The NAND gate 130 responds by resetting the first and second D flip-flops 110, 120, which in turn produce zero (or null) signals. By repeating this process, a series of spikes (or pulses) are produced on the UP and DOWN outputs (see, e.g., FIG. 2). The UP and DOWN signals are then provided to an oscillation circuit (not shown) and used to modify the feedback clock. The PFD 10 is used to achieve and maintain a feedback clock that is matched to the reference clock. The feedback and reference clocks are considered to be matched when the widths of the pulses in the UP and DOWN outputs are matched.

Figure 2:
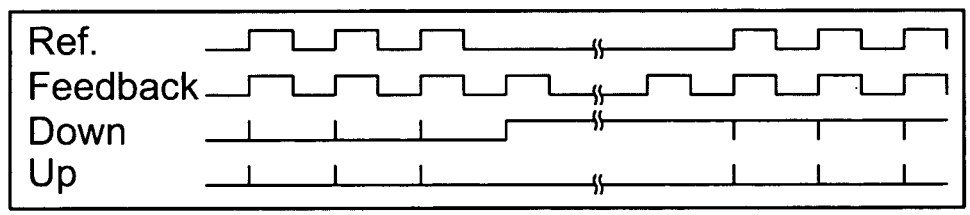
FIG. 2 provides an exemplary timing diagram for the PFD illustrated in FIG. 1.

A drawback of the PFD illustrated in FIG. 1 is the way in which it responds to an interruption in one of its clocks (e.g., the reference clock or feedback clock). This situation is illustrated in FIG. 2, which shows a continuously running feedback clock and an intermittent reference clock. As can be seen, the signals produced on the UP and DOWN outputs are matched (in frequency and pulse width) when the clocks are both running. When the reference clock stops, however, the UP output goes to zero and the DOWN output becomes a flat non-zero DC signal. When the reference clock is restarted, the DOWN output will typically have a pulse width that is much larger than the pulse width in the UP output. This is illustrated by the DOWN output being predominately high and spiking downward and the UP output being predominately low and spiking upward. Such a condition adversely affects the feedback clock (at least temporarily), requires a significant amount of time to correct, and is therefore undesirable.

Figure 3:
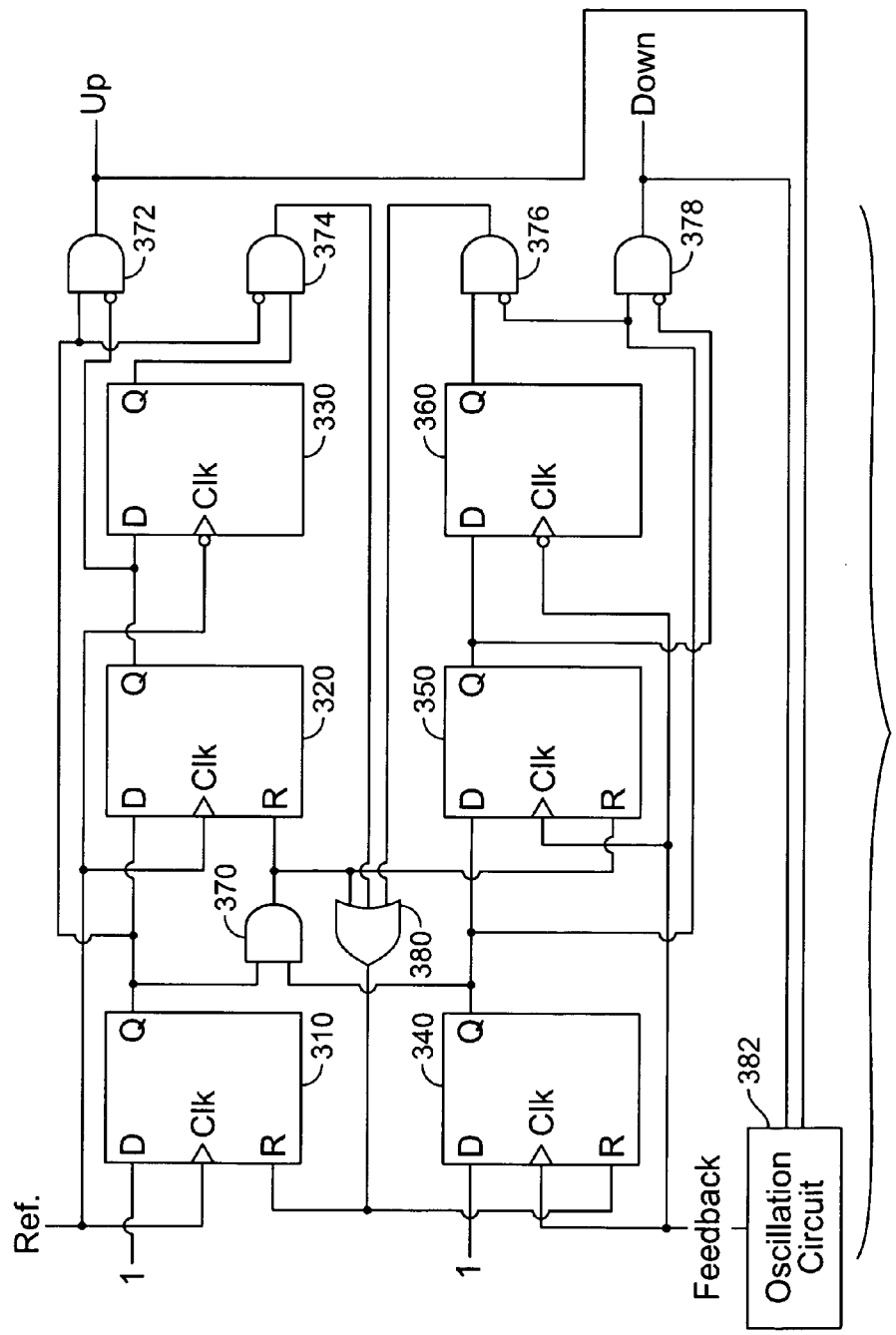
FIG. 3 illustrates a PFD that operates in accordance with a first embodiment of the present invention.

The present invention is directed toward an enhanced PFD that reduces (or in some instances eliminates) the pulse width differential associated with clock interruption. A first embodiment of the present invention is illustrated in FIG. 3. Specifically, PFD 30 includes six D flip-flops (i.e., 310–360), five AND gates (i.e., 370–378), and an OR gate 380. It should be appreciated that the present invention is not limited to the circuit shown in FIG. 3, and may include circuits/devices that are functionally, structurally and/or logically equivalent to the circuit shown in FIG. 3, or any portion thereof. Thus, for example, a circuit that includes additional, fewer or different logic devices (e.g., NANDs, NORs, inverters, etc.) and/or clocking devices (e.g., flip-flops (any type), latches, etc.) is considered to be within the spirit and scope of the present invention. While PFD's can be designed to accept a number of different inputs and to produce a number of different outputs, the present invention is described in terms of a logic one signal(s) being received and a corresponding output(s) being produced. It should be appreciated, however, that the present invention is not so limited, and that a PFD that receives and produces any type of signal (e.g., $V_{DD}$, zero volts, three volts, five volts, etc.) is within the spirit and scope of the present invention.

With reference to FIG. 3, the first flip-flop 310, second flip-flop 340, and AND gate 370 are similar in operation to the PFD shown in FIG. 1. The outputs of these flip-flops, however, are provided to additional devices (flip-flops, gates, etc.) to increase the PFD's functionality. Specifically, the output of flip-flop 310 is provided to AND gate 370, flip-flop 320, and AND gates 372, 374. Similarly, the output of flip-flop 340 is provided to AND gate, 370, flip-flop 350 and AND gates 376, 378. The output of flip-flop 320 is provided to flip-flop 330 and AND gate 372, and the output of flip-flop 350 is provided to flip-flop 360 and AND gate 378. Finally, the outputs of flip-flops 330 and 360 are provided, respectively, to AND gates 374 and 376.

The AND gate 370 is used to reset flip-flops 310, 320, 340 and 350 when the outputs of flip-flops 310 and 340 are high, which only happens when the reference and feedback clocks are active. If the reference clock becomes inactive, the AND gate 370 will not provide a reset function, and a logic one signal will be provided to flip-flop 350 at a rising edge of (or other transition in) the feedback clock. The logic one signal will then be clocked through flip-flop 350 at the next rising edge of the feedback signal and provided to flip-flop 360 and AND gate 378.

The AND gate 378 controls the DOWN output. When the reference and feedback clocks are functioning properly, the inverted input of AND gate 378 is low, making the DOWN output the same as the output of flip-flop 340. When the reference clock is inactive, the inverted input of AND gate 378 is high, making the DOWN output low regardless of the output of flip-flop 340.

When the reference clock is inactive and a logic one signal is produced by flip-flop 350, the logic one signal is clocked through flip-flop 360 and provided to the non-inverting input of AND gate 376. Because the clock of flip-flop 360 is inverted, signals are clocked through flip-flop 360 on the falling edge of the feedback clock, making flip-flop 360 a half clock cycle behind flip-flops 340 and 350.

When the reference clock is reactivated, a logic one signal is clocked through flip-flop 310 and provided to AND gate 370. AND gate 370 then resets flip-flops 310, 320, 340 and 350 and a logic zero signal is provided to the inverted input of AND gate 376. AND gate 376 then holds flip-flops 310 and 340 in a reset state for half a feedback clock cycle. This is because the logic zero signal produced by flip-flop 350 (due to the AND gate 370 reset) is not acted upon by flip-flop 360 for half a clock cycle. Once the logic zero signal is clocked through flip-flop 360 and provided to the non-inverting input of AND gate 376, the flip-flops 310 and 340 are released from their reset state, and the circuit operates normally, as previously discussed.

Figure 4:
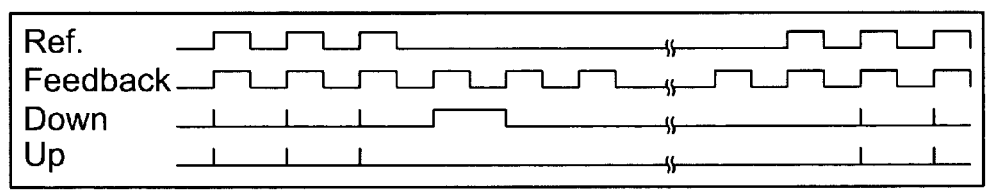
FIG. 4 provides a first exemplary timing diagram for the PFD illustrated in FIG. 3.

An exemplary timing diagram of the PFD 30 shown in FIG. 3 is provided in FIG. 4. The timing diagram shows how the DOWN and UP outputs function properly until the reference clock is inactive (or turned off). On the first rising edge of the feedback clock, the DOWN output is brought high. Because flip-flop 340 is not reset, the high signal is provided to flip-flop 350. The high signal is clocked through flip-flop 350 on the next rising edge of the feedback clock, which produces a DOWN output that is low. The DOWN output remains low until the reference clock is reactivated. The first rising edge of the reference clock resets flip-flops 310, 320, 340 and 350. The AND gate 376 then holds flip-flops 310 and 340 in a reset state until the next falling edge of the feedback signal, or half a clock cycle. On the next rising edges of the feedback and reference clocks, respectively, the DOWN and UP outputs return to normal.

Figure 5:
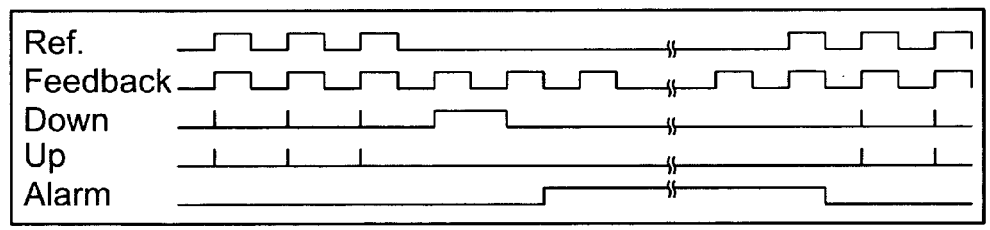
FIG. 5 provides a second exemplary timing diagram for the PFD illustrated in FIG. 3.

In a second embodiment of the present invention, a signal or an alarm is provided to indicate that a clock signal has become inactive. This can be accomplished, for example, by placing alarm lines from the non-inverting inputs of AND gates 374 and 376 (or the outputs of flip-flops 330, 360). Specifically, the signal produced at the non-inverting input of AND gate 374 can be used to indicate when the feedback clock has failed, and the signal produced at the non-inverting input of AND gate 376 can be used to indicate when the reference clock has failed. An exemplary timing diagram of the latter is provided in FIG. 5.

The drawback of a traditional type 4 PFD, as previously discussed, is also present when a clock is changed from one source to another. In such a situation, it would be advantageous to hold the PFD (or certain flip-flops located therein) in a reset state while the clock is being switched. The PFD shown in FIG. 6, which operates in accordance with a third embodiment of the present invention, includes circuitry for performing this function.

Figure 6:
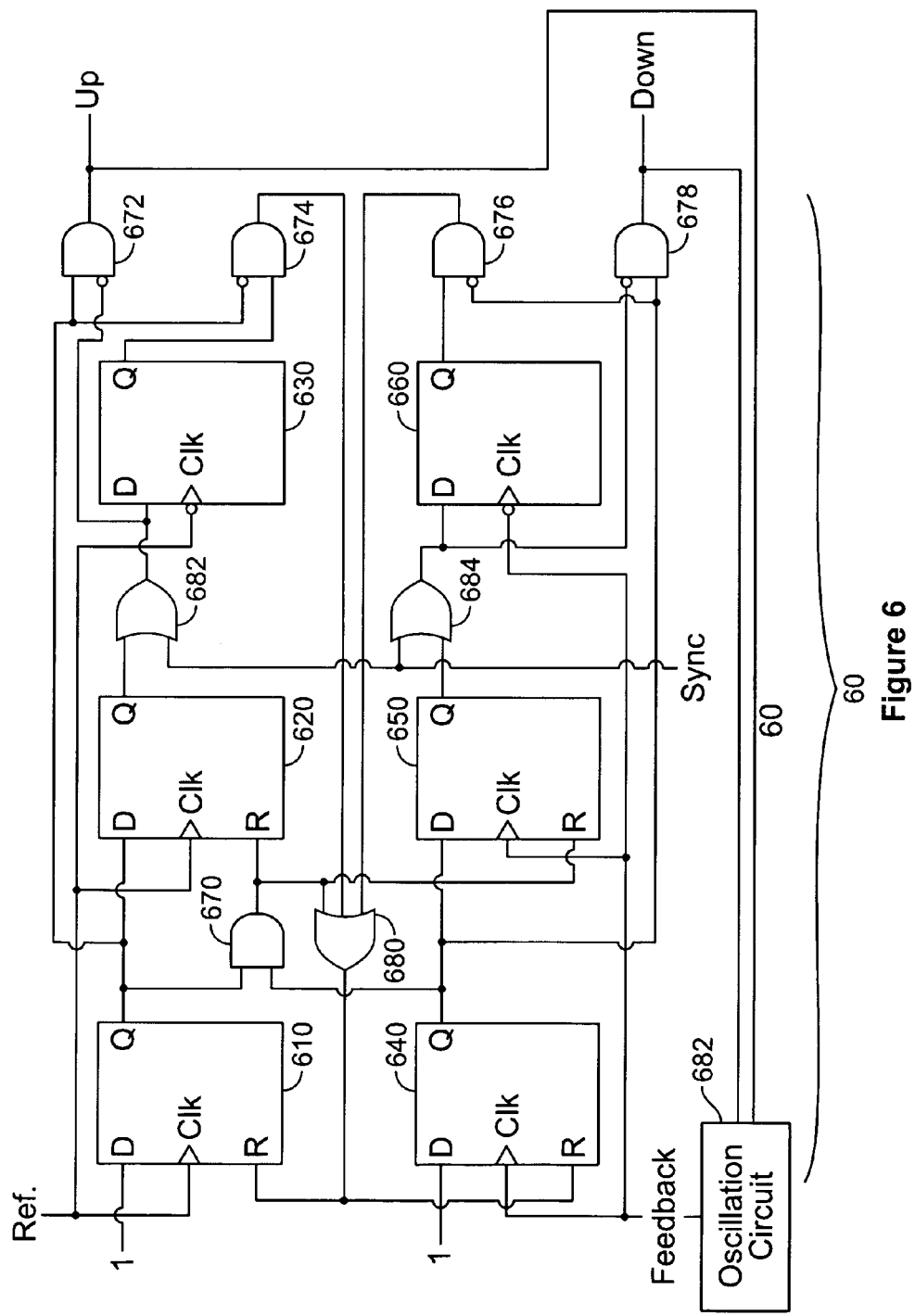
FIG. 6 illustrates a PFD that operates in accordance with a second embodiment of the present invention.

The PFD 60 shown in FIG. 6 operates in the same manner as the PFD 30 shown in FIG. 3, with the exception that the PFD 60 shown in FIG. 6 can be triggered (e.g., by a sync signal) to hold flip-flops 610 and 640 in a reset state so that, for example, a clock signal can be switched from one source to another.

Figure 7:
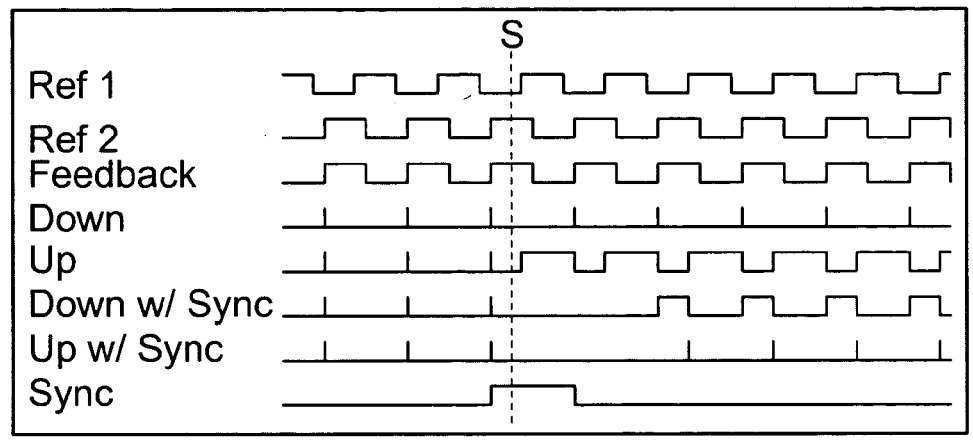
FIG. 7 provides an exemplary timing diagram for the PFD illustrated in FIG. 6.

An exemplary timing diagram of the PFD shown in FIG. 6 is provided in FIG. 7. The diagram shows how DOWN and UP outputs would function with and without a forced reset if the reference clock signal is changed from a second source to a first. Specifically, if the reference clock is switch from a reference2 clock to a reference1 clock at point "S," then the UP output goes high at the next rising edge of the reference1 clock and remains high until the next rising edge of the feedback clock, which is when flip-flops 610 and 640 are reset. This produces an UP output that has a relatively large pulse width, or a pulse width that is larger than it otherwise could be. The outputs will then need to be adjusted (e.g., to match), which can take an undesirable amount of time.

If the flip-flops, however, are placed into a reset state before the clocks are switched, and release after the clocks are switched, then the UP output goes high at the next rising edge of the feedback clock and remains high until the next rising edge of the references clock. This produces an UP output that has a relatively small pulse width.

Figure 8:
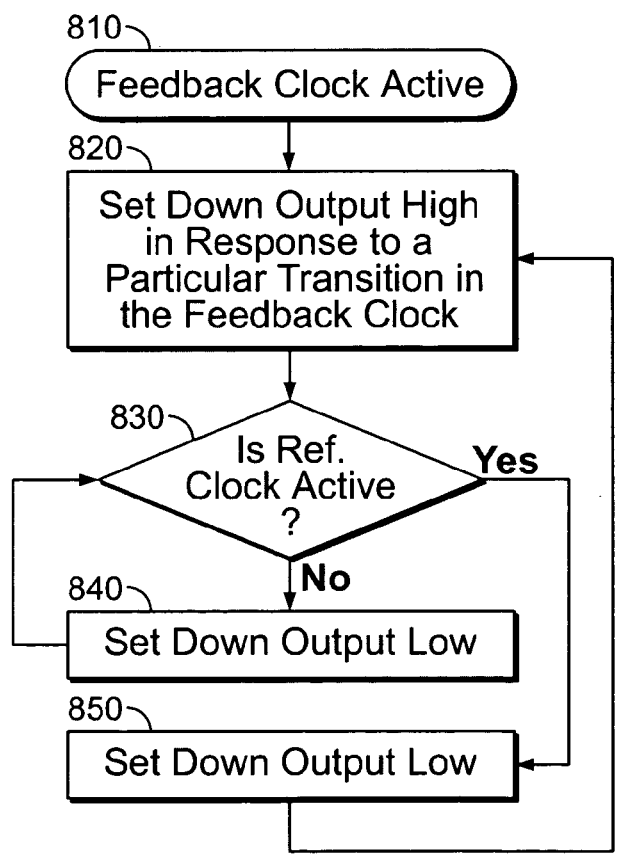
FIG. 8 provides a method of detecting the presence or absence of a clock in a PFD in accordance with one embodiment of the present invention.

A method of detecting the presence or absence of a clock in a PFD in accordance with one embodiment of the present invention is provided in FIG. 8. Specifically, if the feedback clock is active at 810, the DOWN output is set high in response to a particular transition (e.g., a rising edge, etc.) in the feedback clock at step 820. A determination is then made, at step 830, whether the reference clock is active. If it is determined that the reference clock is active, then the DOWN output is set low at step 850, and the process begins again at step 820. If, however, it is determined that the reference clock is inactive, then the DOWN output is forced low at step 840 until the reference clock is reactivated.

Having thus described several embodiments of a system and method of detecting the absence (or failure) of a clock in a PFD and holding at least one output in a reset (or default) state until an active clock is detected, it should be apparent to those skilled in the art that certain advantages of the within described system and method have been achieved. It should also be appreciated that various modifications, adaptations, and alternative embodiments thereof may be made within the scope and spirit of the present invention. The invention is solely defined by the following claims.

What is claimed is:

1. A phase frequency detector (PFD) system, comprising:
a first circuit having a first output, said first circuit being adapted to receive a first clock signal and a first voltage and to apply said first voltage to said first output in response to a transition in said first clock signal;
a second circuit having a second output, said second circuit being adapted to receive a second clock signal and a second voltage and to apply said second voltage to said second output in response to a transition in said second clock signal;
a third circuit adapted to:
determine whether said first clock signal was received by said first circuit and whether said second clock signal was received by said second circuit;
reset said second circuit if said first clock signal was received by said first circuit and said second clock signal was received by said second circuit, said second circuit being adapted to remove said second voltage from said second output in response to being reset; and
control whether said second output is provided to an output of said PFD, said third circuit being adapted to prevent said second voltage from being applied to said output of said PFD if said first clock signal was not received by said first circuit and to allow said second voltage to be applied to said output of said PFD if said first clock signal is subsequently received by said first circuit.

2. The PFD system of claim 1, wherein said second circuit comprises a flip-flop circuit.

3. The PFD system of claim 1, wherein said second clock signal is provided by an oscillation circuit and based at least in part on said output of said PFD.

4. The PFD system of claim 1, wherein said first and second voltages are substantially the same and correspond to a logic one signal.

5. The PFD system of claim 1, wherein said third circuit comprises at least two flip-flop circuits.

6. The PFD system of claim 5, wherein said third circuit further comprises a plurality of logic gates.

7. The PFD system of claim 6, wherein said plurality of logic gates include at least one AND gate and at least one OR gate.

8. The PFD system of claim 7, wherein said at least one AND gate is connected to said first output, said second output, and an input of said second circuit and adapted to apply a third voltage to said input of said second circuit if said first output is equal to said first voltage and said second output is equal to said second voltage, said third voltage being adapted to reset said second circuit.

9. The PFD system of claim 8, wherein said third voltage is further applied to an input of a first one of said at least two flip-flop circuits, said third voltage being adapted to reset said first one of said at least two flip-flop circuits.

10. The PFD system of claim 5, wherein a first one of said at least two flip-flop circuits is configured to provided a signal received from said second output to a second one of said at least two flip-flop circuits and an output-circuitry portion of said third circuit during a subsequent transition in said second clock signal, said output of said PFD being provided by said output circuitry portion of said third circuit.

11. The PFD system of claim 10, wherein said output-circuitry portion of said third circuit includes an AND gate.

12. The PFD system of claim 10, wherein said first one of said at least two flip-flop circuits is configured to provide said signal to a second one of said at least two flip-flop circuits and an output-circuitry portion of said third circuit during a first rising edge of said second clock signal after said transition in said second clock.

13. The PFD system of claim 10, wherein said third circuit is further adapted to reset said second circuit in response to said first clock signal being subsequently provided to said first circuit.

14. The PFD system of claim 13, wherein said second one of said at least two flip-flop circuits is adapted to hold said second circuit in a reset state for a period that is substantially equal to half a clock cycle included in said second clock signal if said second voltage is provided to said second one of said at least two flip-flop circuits and said second circuit is reset.

15. A phase-locked loop (PLL) circuit, comprising:
a phase frequency detector (PFD) circuit comprising:
a first flip-flop adapted to receive a reference clock and a logic one signal and to output a logic one signal in response to a rising edge of said reference clock;
a second flip-flop adapted to receive a feedback clock and a logic one signal and to output a logic one signal in response to a rising edge of said feedback clock;
an AND gate adapted to reset said first and second flip-flops if said first flip-flop output is a logic one signal and second flip-flop output is a logic one signal, said first and second flip-flops being adapted to output a logic zero signal in response to being reset;
a first output circuit adapted to produce an UP output based at least in part on said output of said first flip-flop;
a second output circuit adapted to produce a DOWN output based at least in part on said output of said second flip-flop; and
a clock-failure circuit adapted to provide a signal to said second output circuit during a next rising edge of said feedback clock if said second flip-flop is not reset by said AND gate, said signal being used by said second output circuit to place a logic zero signal on said DOWN output; and
an oscillation circuit adapted to produce said feedback clock, said feedback clock being based at least in part on said UP and DOWN outputs.

16. The PLL system of claim 15, wherein said clock-failure circuit includes a third and fourth flip-flop, said third flip-flop for sending said signal to said second output circuit during a next rising edge of said feedback clock if said second flip-flop is not reset by said AND gate, and said fourth flip-flop for sending a second signal to said first output circuit during a next rising edge of said reference clock if said first flop-flop is not reset by said AND gate, said second signal being used by said first output circuit to place a logic zero signal on said UP output.

17. The PLL system of claim 16, wherein said clock-failure circuit further includes a fifth and sixth flip-flop, said fifth flip-flop for holding said first flip-flop in a reset state for half a reference clock cycle after (i) said feedback clock is subsequently received and (ii) said AND gate resets said first flip-flop, and said sixth flip-flop for holding said second flip-flop in a reset state for half a feedback clock cycle after (i) said reference clock is subsequently received and (ii) said AND gate resets said second flip-flop.

18. The PLL system of claim 17, wherein said clock-failure circuit further includes two OR gates connected to a sync line and said fifth and sixth flip-flops, said OR gates being adapted to initiate a reset of said first and second flip-flops in response to receiving a sync signal over said sync line.

19. A method of improving performance in a phase frequency detector (PFD), said PFD including at least a first and second clock and at least a first and second output, comprising:
receiving said first clock signal;
setting said first output high at a first rising edge in said first clock signal;
determining whether said second clock signal has been received;
setting said first output low before a second rising edge in said first clock signal if said second clock signal has been received; and
setting said first output low at said second rising edge in said first clock signal if said second clock signal has not been received.

20. The method of claim 19, wherein said step of setting said first output low before a second rising edge in said first clock signal further comprises resetting a first flip-flop if said first flip-flop and a second flip-flop are producing a logic one signal.

21. The method of claim 19, wherein said step of setting said first output low at said second rising edge in said first clock signal further comprises:
receiving a logic signal in response to said first rising edge of said first clock signal;
identifying presence of said logic signal during said second rising edge of said first clock signal; and
providing said logic signal to a logic gate whose output is said first output, said logic signal having the result of producing a logic zero on said first output.

22. The method of claim 19, further comprising the steps of:
resetting said first flip-flop after said second clock signal is subsequently received; and
holding said first flip-flop in a reset state for half a clock cycle included in said first clock signal.

23. The method of claim 19, further comprising the step of setting said first and second output signals low in response to receiving a sync signal and holding said first and second output signals low until said sync signal is no longer received.

* * * * *